(12) United States Patent
Imaizumi et al.

(10) Patent No.: US 8,674,520 B2
(45) Date of Patent: Mar. 18, 2014

(54) SEMICONDUCTOR DEVICE, METHOD FOR MANUFACTURING THE SAME, AND POWER SUPPLY UNIT

(75) Inventors: Nobuhiro Imaizumi, Kawasaki (JP);
Keishiro Okamoto, Kawasaki (JP);
Keiji Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/355,805

(22) Filed: Jan. 23, 2012

(65) Prior Publication Data
US 2012/0211899 A1    Aug. 23, 2012

(30) Foreign Application Priority Data

Feb. 22, 2011 (JP) .................................. 2011-036253

(51) Int. Cl.
*H01L 29/40* (2006.01)
(52) U.S. Cl.
USPC ........... 257/782; 257/746; 257/777; 257/783; 257/785; 257/E21.499; 257/E23.04; 257/E23.141; 438/119; 438/120
(58) Field of Classification Search
USPC .......... 257/777, 782, 783, 785, 746, E21.499, 257/E23.04, E23.141; 438/119, 120
See application file for complete search history.

(56) References Cited

U.S. PATENT DOCUMENTS

| 4,883,708 | A | * | 11/1989 | Kariya et al. | 442/198 |
| 5,068,061 | A | * | 11/1991 | Knobel et al. | 252/511 |
| 6,124,637 | A | * | 9/2000 | Freyman et al. | 257/736 |
| 6,188,582 | B1 | * | 2/2001 | Peter | 361/760 |
| 6,861,750 | B2 | * | 3/2005 | Zhao et al. | 257/739 |

FOREIGN PATENT DOCUMENTS

| JP | 58-207645 | 12/1983 |
| JP | 6-132442 | 5/1994 |
| JP | 2006-156437 A1 | 6/2006 |

* cited by examiner

*Primary Examiner* — Asok K Sarkar
(74) *Attorney, Agent, or Firm* — Kratz, Quintos & Hanson, LLP

(57) ABSTRACT

A method for manufacturing a semiconductor device includes placing a sheet containing a fibrous material having at least one outer surface having a metal on a semiconductor chip-mounting region of a substrate; forming a bonding layer containing a fusible metal on the semiconductor chip-mounting region; placing a semiconductor chip on the semiconductor chip-mounting region; and bonding the semiconductor chip to the semiconductor chip-mounting region with the fusible metal-containing bonding layer by heating.

19 Claims, 11 Drawing Sheets

SEMICONDUCTOR DEVICE, METHOD FOR MANUFACTURING THE SAME, AND POWER SUPPLY UNIT

CROSS-REFERENCE TO RELATED APPLICATION

This application is based upon and claims the benefit of priority of the prior Japanese Patent Application No. 2011-36253, filed on Feb. 22, 2011, the entire contents of which are incorporated herein by reference.

FIELD

The embodiments discussed herein relate to a semiconductor device, a method for manufacturing the same, and a power supply unit.

BACKGROUND

There are conventional high electron mobility transistors (HEMTs) having a semiconductor multilayer structure including a carrier travel layer and a carrier supply layer.

In recent years, GaN-HEMTs having a HEMT structure including an electron travel layer containing GaN and an electron supply layer containing AlGaN, the electron travel layer and the electron supply layer being stacked, are under active development based on heterojunctions of AlGaN and GaN, which are GaN compound semiconductors.

GaN has a bandgap of about 3.4 eV, which is larger than the bandgap (about 1.1 eV) of Si and the bandgap (about 1.4 eV) of GaAs, and therefore is a material having high breakdown field strength. GaN is also a material having high saturated electron velocity. Therefore, GaN is promising as a material for achieving semiconductor devices, enabling high-voltage operation, for power supplies capable of obtaining high power. GaN-HEMTs are expected as, for example, high-efficiency switching elements for use in power supply units provided in electronic apparatuses or high-voltage power devices for use in electric vehicles.

A semiconductor chip including such a GaN-HEMT is mounted on a substrate such as a circuit board or a stage of a lead frame.

A technique for mounting the semiconductor chip on the substrate is as follows: the back surface of the semiconductor chip is bonded to a semiconductor chip-mounting region of the substrate using, for example, a die bonding agent such as solder or an adhesive, thereby mounting the semiconductor chip on the substrate.

For related art, the following documents have been disclosed: Japanese Laid-open Patent Publication No. 2006-156437, Japanese Laid-open Patent Publication No. 6-132442, Japanese Laid-open Patent Publication No. 58-207645, and the like.

SUMMARY

According to an aspect of an embodiment, a method for manufacturing a semiconductor device includes placing a sheet containing a fibrous material having at least one outer surface having a metal on a semiconductor chip-mounting region of a substrate; forming a bonding layer containing a fusible metal on the semiconductor chip-mounting region; placing a semiconductor chip on the semiconductor chip-mounting region; and bonding the semiconductor chip to the semiconductor chip-mounting region with the fusible metal-containing bonding layer by heating.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Semiconductor devices, manufacturing methods, and power supply units according to embodiments discussed herein will now be described with reference to the accompanying drawings.

A semiconductor device according to a first embodiment and a method for manufacturing the semiconductor device are described below with reference to FIGS. 1 to 7.

The semiconductor device according to this embodiment is a compound semiconductor device containing a nitride (for example, GaN) compound semiconductor and is also a semiconductor package prepared by a resin-encapsulated semiconductor chip having a nitride semiconductor multilayer structure including a carrier travel layer and a carrier supply layer. The semiconductor chip is also referred to as a semiconductor element.

A discrete package is exemplified below.

Figure 7:
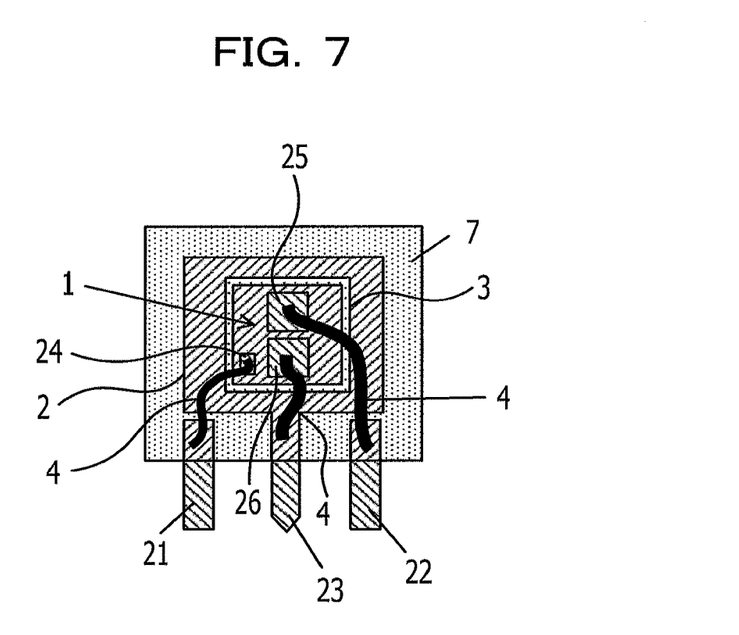
FIG. 7 is a plan view illustrating an example of the configuration of the semiconductor device according to the first embodiment.

With reference to FIG. 7, the semiconductor device includes a semiconductor chip 1, a stage 2 for mounting the semiconductor chip 1, a bonding layer 3, a gate lead 21, a source lead 22, a drain lead 23, bonding wires 4 (herein Al wires), and a molding compound 7. The molding compound 7 is also referred to as a molding resin. The stage 2 is a portion of a lead frame. The stage 2 is also referred to as a substrate. The bonding wires 4 may be Au or Cu wires.

The semiconductor chip 1 is mounted on the stage 2 and has a gate pad 24, a source pad 25, and a drain pad 26 coupled to the gate lead 21, the source lead 22, and the drain lead 23, respectively, through the bonding wires 4. These components are encapsulated with the molding compound 7.

The stage 2 is fixed to the back surface (substrate back surface) of the semiconductor chip 1 and is integral with the drain lead 23. The stage 2 and the drain lead 23 are electrically coupled to each other. Therefore, connecting the drain pad 26 to the stage 2 through one of the bonding wires 4 allows the drain pad 26 to be coupled to the drain lead 23 through this bonding wire 4. This embodiment is not limited to such a configuration and the stage 2 may be electrically coupled to the source lead 22.

The semiconductor chip 1 includes a GaN-HEMT having a GaN semiconductor multilayer structure including a GaN electron travel layer and a AlGaN electron supply layer and is, for example, a GaN-HEMT chip for power supplies for use in switching elements provided in electronics or power supply units. The semiconductor chip 1 includes a gate electrode, source electrode, and drain electrode arranged above the GaN semiconductor multilayer structure and also includes a wiring layer, disposed above these electrodes, including wiring lines. The gate pad 24, the source pad 25, and the drain pad 26 are exposed at the front surface of the semiconductor chip 1. The GaN-HEMT is also referred to as a GaN-based HEMT. The GaN-HEMT chip is also referred to as a GaN-based HEMT chip.

A method for manufacturing the semiconductor device (discrete package) according to the present embodiments is described below with reference to FIGS. 1A to 1E. The method for manufacturing the semiconductor device is also referred to as a semiconductor chip-mounting method.

Figure 1A:
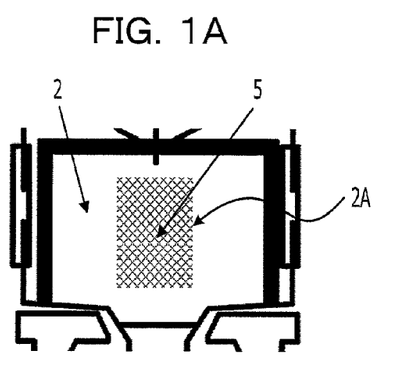
FIGS. 1A to 1E are plan views illustrating an example of a method for manufacturing a semiconductor device according to a first embodiment.
Figure 1B:
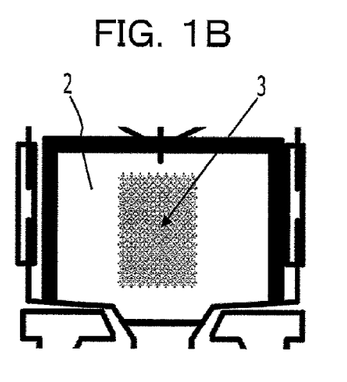
Figure 1C:
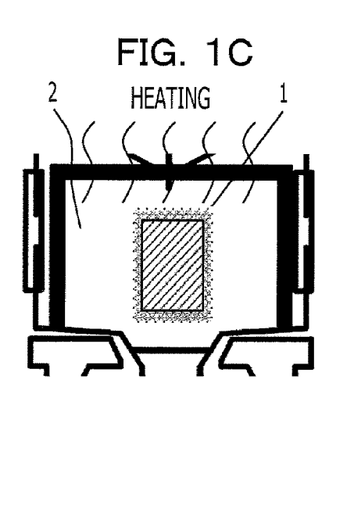

As shown in FIGS. 1A to 1C, the semiconductor chip 1, which has the GaN semiconductor multilayer structure including the GaN electron travel layer and the AlGaN electron supply layer, is fixed onto the stage 2 of the lead frame. Details are described below.

Figure 1D:
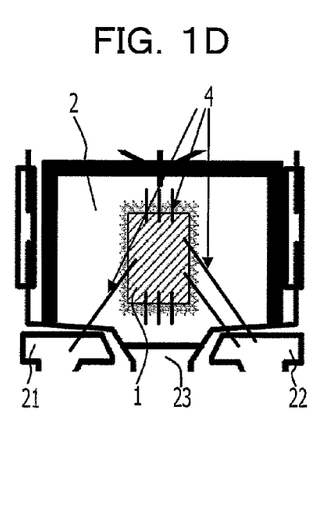

As shown in FIG. 1D, wire bonding is performed. That is, the gate pad 24, source pad 25, and drain pad 26 of the semiconductor chip 1 are coupled to the gate lead 21, the source lead 22, and the drain lead 23, respectively, with the bonding wires 4 (see FIG. 7). This allows the semiconductor chip 1 to be electrically coupled to the lead frame. The bonding wires 4 are referred to as metal wires.

Figure 1E:
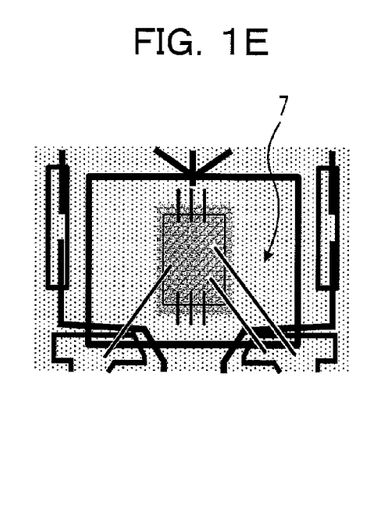

As shown in FIG. 1E, the semiconductor chip 1 is resin-encapsulated by, for example, a transfer molding process in such a state that the semiconductor chip 1 is mounted on the lead frame. That is, the molding compound 7 is formed to encapsulate the semiconductor chip 1.

The gate lead 21 and the source lead 22 are separated from the lead frame, which is not shown, whereby the semiconductor device (discrete package) is obtained.

Figure 11:
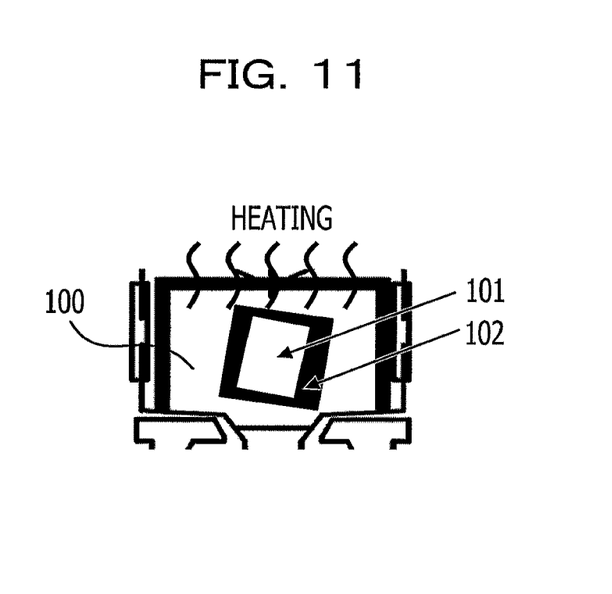
FIG. 11 is a plan view illustrating a problem with the present embodiment.

In the case of using, for example, a die bonding agent 102 such as solder or an adhesive made of a heat-conductive resin to fix the semiconductor chip 1 onto the stage 2 of the lead frame as shown in FIG. 11, the semiconductor chip 1 is displaced, moved, or rotated because the die bonding agent 102 is unevenly distributed (for example, solder wetting coverage is uneven) during heating and bonding.

Therefore, in this embodiment, the semiconductor chip 1 is fixed on the stage 2 of the lead frame as described below.

As shown in FIG. 1A, a sheet made of a fibrous metal material, that is, a fibrous material sheet 5 is placed on a semiconductor chip-mounting region 2A of the stage 2 of the lead frame. The semiconductor chip-mounting region 2A is also referred to as a semiconductor chip-mounting site or a semiconductor chip-mounting area.

The fibrous material sheet 5 has an area substantially equal to the area of the semiconductor chip 1. In this embodiment, the semiconductor chip 1, which is mounted on semiconductor chip-mounting region 2A of the stage 2 of the lead frame, has a size of about 4.5 mm×about 7 mm. Therefore, the fibrous material sheet 5 has a size of about 4.5 mm×about 7 mm.

In particular, the fibrous material sheet 5 preferably contains a fibrous metal material capable of being alloyed with a fusible metal used to bonding the stage 2 of the lead frame to the back surface of the semiconductor chip 1. In this embodiment, the fibrous material sheet 5 is formed from a single metal material and is particularly made of copper. A material for forming the fibrous material sheet 5 is not limited to these material and may be a metal material having wettability to the fusible metal. In particular, the fibrous material sheet 5 is preferably made of, for example, a material, such as Cu, Ni, Ag, or Au, capable of being alloyed with the fusible metal. A material used in the lead frame is, for example, a metal material such as Ni, Cu, Au, Pt, Ag, or Pd and preferably has wettability to the fusible metal.

Figure 2A:
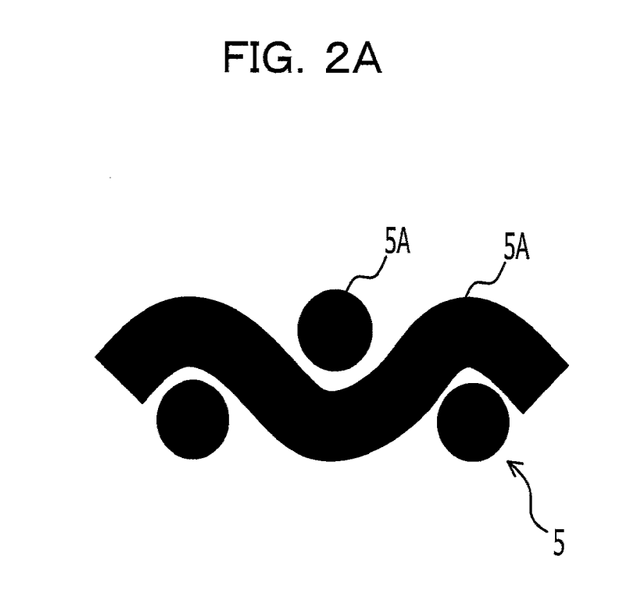
FIGS. 2A and 2B are sectional views of an example of a fibrous material sheet used in the method for manufacturing the semiconductor device according to the first embodiment.
Figure 2B:
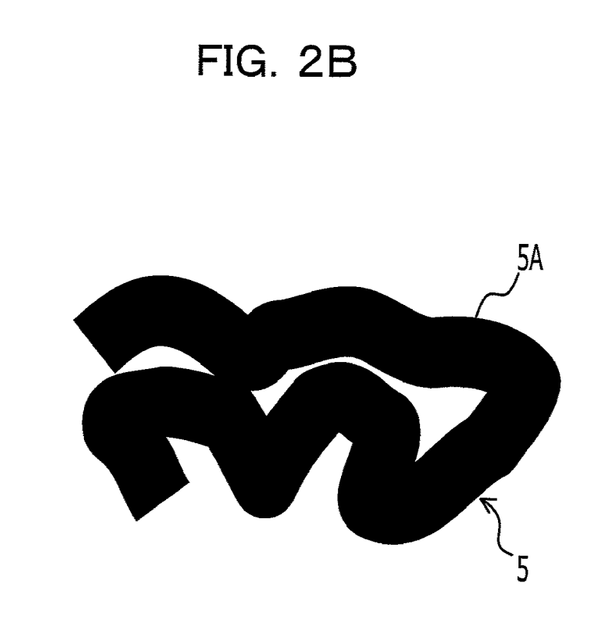

The fibrous material sheet 5 may have a network structure in which a fibrous metal material 5A is net-like as shown in FIG. 2A or a nonwoven structure in which the fibrous metal material 5A is nonwoven as shown in FIG. 2B.

After the fibrous material sheet 5 is placed on the semiconductor chip-mounting region 2A, the fibrous material sheet 5 is preferably temporarily bonded to the semiconductor chip-mounting region 2A with an ultrasonic wave such that the fibrous material sheet 5 placed on the semiconductor chip-mounting region 2A of the stage 2 is not displaced.

As shown in FIG. 1B, the bonding layer 3 is formed on the semiconductor chip-mounting region 2A of the stage 2 of the lead frame. The bonding layer 3 serves as a layer for bonding the stage 2 of the lead frame and the back surface of the semiconductor chip 1 together and contains the fusible metal (fusible metal material). In this operation, the bonding layer 3, which contains the fusible metal, is formed on the fibrous material sheet 5 placed on the semiconductor chip-mounting region 2A of the stage 2.

The fusible metal is preferably one which is melted at a temperature of about 300° C. or less and which has a relatively low melting point and may be, for example, solder (solder material) such as Sn—Ag—Cu or Sn—Cu, indium, tin, or the like.

The bonding layer 3, which contains the fusible metal, is any one of a layer containing a sheet-shaped fusible metal, a layer containing a pasty fusible metal, and a layer of a heat-conductive adhesive containing the fusible metal and resin (resin material or thermosetting resin material).

The pasty fusible metal is, for example, a mixture of the fusible metal and flux. The heat-conductive adhesive is, for example, a mixture of a particulate fusible metal and resin. Alternatively, the heat-conductive adhesive is, for example, a mixture of an adhesive component and metal filler such as solder, the adhesive component being obtained by mixing an epoxy resin with a flux ingredient such as an organic acid.

The sheet-shaped fusible metal is, for example, a Sn—Ag—Cu solder sheet. The placement of the Sn—Ag—Cu solder sheet on the fibrous material sheet 5 allows the bonding layer 3 to be formed on the fibrous material sheet 5 such that the bonding layer 3 contains the sheet-shaped fusible metal. The pasty fusible metal is, for example, a Sn—Ag—Cu solder paste. The placement of the Sn—Ag—Cu solder paste on the fibrous material sheet 5 allows the bonding layer 3 to be formed on the fibrous material sheet 5 such that the bonding layer 3 contains the pasty fusible metal. The pasty fusible metal may be, for example, nano-paste which contains nanometer-sized metal particles and which can be sintered by activating the surfaces of the metal particles. The heat-conductive adhesive, which contains the fusible metal and resin, is one containing, for example, Sn—Ag—Cu solder particles with an average size of about 22 μm and resin. The placement of the heat-conductive adhesive on the fibrous material sheet 5 allows the bonding layer 3 to be formed on the fibrous material sheet 5 such that the bonding layer 3 contains the heat-conductive adhesive. The pasty fusible metal or the heat-conductive adhesive can be provided on the fibrous material sheet 5 in such a manner that the pasty fusible metal or the heat-conductive adhesive is applied to or printed on the fibrous material sheet 5 by, for example, a dispensing process or a printing process such as a screen printing process. This allows the bonding layer 3 to be formed on the fibrous material sheet 5 such that the bonding layer 3 contains the pasty fusible metal or the heat-conductive adhesive.

In particular, in the case of using the sheet-shaped fusible metal, it is preferred that after the fibrous material sheet 5 is placed on the semiconductor chip-mounting region 2A of the stage 2 and the bonding layer 3 containing the sheet-shaped fusible metal is formed thereon, the fibrous material sheet 5 and the bonding layer 3 containing the sheet-shaped fusible metal are temporarily bonded to the semiconductor chip-mounting region 2A with an ultrasonic wave. In this case, the fibrous material sheet 5 and the bonding layer 3 containing the sheet-shaped fusible metal may be simultaneously bonded to the semiconductor chip-mounting region 2A. Alternatively, after the fibrous material sheet 5 is bonded to the semiconductor chip-mounting region 2A, the bonding layer 3 containing the sheet-shaped fusible metal may be bonded to the fibrous material sheet 5 bonded to the semiconductor chip-mounting region 2A. This allows the fibrous material sheet 5 placed on the semiconductor chip-mounting region 2A of the stage 2 and the bonding layer 3 containing the sheet-shaped fusible metal to be not displaced. In the case of performing temporary bonding using such an ultrasonic wave as described above, the bonding layer 3 containing the sheet-shaped fusible metal may be melted in a heating or bonding step below in such a manner that the bonding layer 3 containing the sheet-shaped fusible metal is heated in an inert or reducing atmosphere.

In the case of using the sheet-shaped fusible metal to form the bonding layer 3, the fibrous material sheet 5 preferably contains flux (flux material). This secures bonding with the fusible metal and allows the fibrous material sheet 5 to be appropriately placed.

In this embodiment, the fibrous material sheet 5 is placed on the semiconductor chip-mounting region 2A of the stage 2 and the bonding layer 3 is then formed. This embodiment is not limited to this procedure. After the bonding layer 3 is then formed, the fibrous material sheet 5 may be placed thereon.

As shown in FIG. 1C, the semiconductor chip 1 is aligned with the semiconductor chip-mounting region 2A of the stage 2 of the lead frame and the semiconductor chip 1 is placed on the semiconductor chip-mounting region 2A of the stage 2. That is, the semiconductor chip 1 is aligned with the semiconductor chip-mounting region 2A of the stage 2 and the semiconductor chip 1 is mounted on the semiconductor chip-mounting region 2A with, for example, a chip bonder in a face-up position. In this operation, the semiconductor chip 1 is placed over the fibrous material sheet 5 placed on the semiconductor chip-mounting region 2A of the stage 2 and the bonding layer 3 containing the fusible metal. The back surface of the semiconductor chip 1 preferably has a material having wettability to the fusible metal. The back surface of the semiconductor chip 1 is preferably is metalized with, for example, Ti—Ni—Cu, Ti—Cu—Ni—Au, Ti—Au, or the like such that Au is present outermost.

The semiconductor chip 1 is bonded to the semiconductor chip-mounting region 2A of the stage 2 of the lead frame with the bonding layer 3 containing the fusible metal by heating. In particular, in the case of using the fibrous material sheet 5 containing the fibrous metal material capable of being alloyed with the fusible metal, the fusible metal contained in the bonding layer 3 is alloyed with a metal making up the fibrous material sheet 5 during heating and bonding and therefore the semiconductor chip 1 is bonded to the semiconductor chip-mounting region 2A of the stage 2 with the bonding layer 3. This allows the semiconductor chip 1 to be fixed on the stage 2 of the lead frame.

In the case of using the sheet-shaped fusible metal and the pasty fusible metal, the fusible metal contained in the bonding layer 3 is melted by heating the bonding layer 3 at a maximum temperature of about 250° C. in, for example, a reflow oven such that the fibrous material sheet 5 is impregnated with the fusible metal, whereby the semiconductor chip 1 is bonded to the semiconductor chip-mounting region 2A of the stage 2 with the bonding layer 3 containing the fusible metal.

In particular, in the case of using the sheet-shaped fusible metal and performing temporary bonding using an ultrasonic wave, the bonding layer 3 containing the sheet-shaped fusible metal may be melted by heating the bonding layer 3 in an inert or reducing atmosphere. In the case of using the Sn—Ag—Cu solder sheet, the Sn—Ag—Cu solder sheet may be melted by heating the Sn—Ag—Cu solder sheet at a maximum temperature of about 250° C. in, for example, an N2 atmosphere. This allows no flux requiring cleaning to be used.

In the case of using, for example, the heat-conductive adhesive containing the fusible metal and resin, the semiconductor chip 1 is bonded to the semiconductor chip-mounting region 2A of the stage 2 with the bonding layer 3 containing the heat-conductive adhesive in such a manner that the fusible metal contained in the bonding layer 3 is melted and the resin is cured by heating the heat-conductive adhesive at about 250° C. for about ten minutes in a thermostatic chamber. In this case, the fibrous material sheet 5 is impregnated with the fusible metal during heating and bonding. In the case of using the fibrous material sheet 5 containing the fibrous metal material capable of being alloyed with the fusible metal, the fusible metal contained in the bonding layer 3 is alloyed with the metal making up the fibrous material sheet 5 during heating or bonding and a surrounding region is covered with the cured resin after heating or bonding.

The configuration of the semiconductor device manufactured as described above, that is, a structure including the semiconductor chip 1 is as described below.

The semiconductor device according to this embodiment includes the stage 2, the semiconductor chip 1 placed on the stage 2, and the bonding layer 3 which contains the fusible metal and the fibrous metal material (fibrous material) and which bonds the stage 2 and the semiconductor chip 1 together.

In the case of using the fibrous material sheet 5 containing the fibrous metal material capable of being alloyed with the fusible metal during manufacture, the bonding layer 3 of the manufactured semiconductor device contains an alloy of the fusible metal and a metal (that is, the metal making up the fibrous metal material) and the fibrous metal material (fibrous material).

In the case of forming the bonding layer 3 from the heat-conductive adhesive, the bonding layer 3 of the manufactured semiconductor device further contains resin.

Thus, the semiconductor device according to this embodiment and the manufacturing method have an advantage that the semiconductor chip 1 can be kept from being displaced, moved, or rotated when the semiconductor chip 1 is mounted on the stage 2 of the lead frame.

Figure 3:
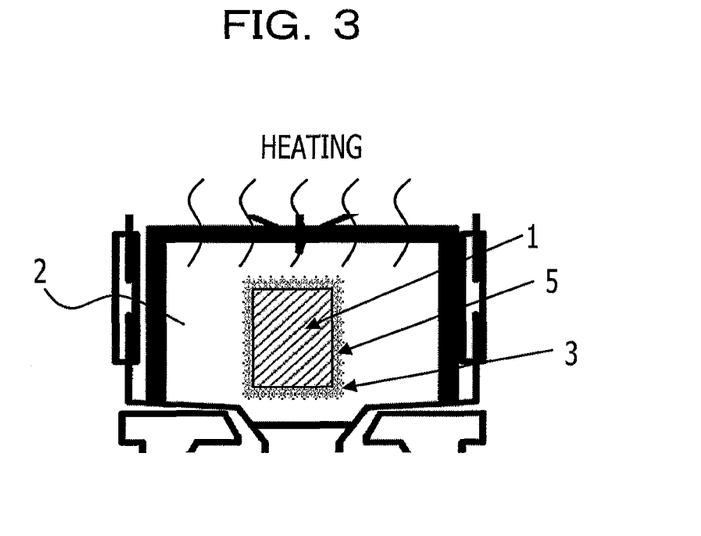
FIG. 3 is a schematic plan view illustrating an effect due to the method for manufacturing the semiconductor device according to the first embodiment.

This is because the fluidity of the bonding layer 3 containing the fusible metal is controlled by the fibrous material sheet 5 when the bonding layer 3 is heated for the purpose of bonding the semiconductor chip 1 to the semiconductor chip-mounting region 2A of the stage 2 of the lead frame. That is, for example, a region where the fusible metal, such as solder, spreads is controlled by the fibrous material sheet 5 and the position of the semiconductor chip 1 is controlled by the self-alignment effect of the fusible metal. Therefore, although being affected by the high surface tension of the bonding layer 3 containing the fusible metal, the semiconductor chip 1 can be held at a desired position as shown in FIG. 3 and can be accurately mounted without misalignment. In contrast, the use of a die bonding agent only causes, for example, the displacement, movement, or rotation of the semiconductor chip 1 during heating and bonding as shown in FIG. 11.

Figure 4:
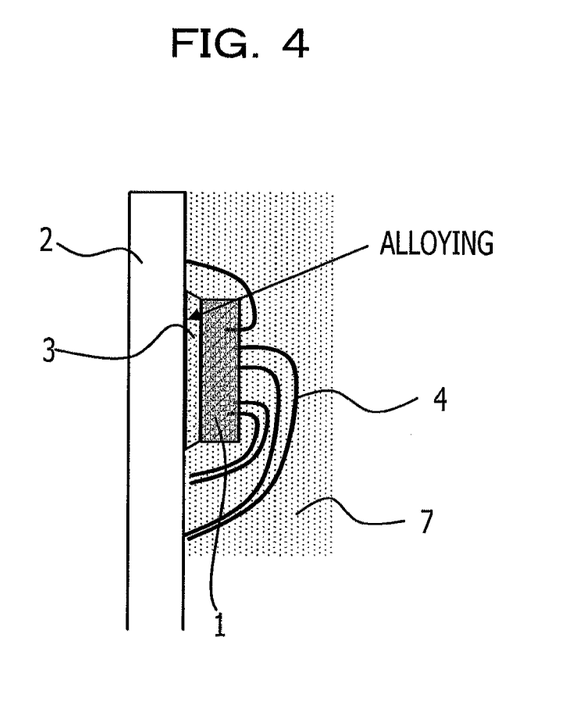
FIG. 4 is a schematic sectional view illustrating an effect due to the method for manufacturing the semiconductor device according to the first embodiment.

Since the fibrous material sheet 5 contains the fibrous metal material capable of being alloyed with the fusible metal, the fusible metal contained in the bonding layer 3 can be alloyed with the metal making up the fibrous material sheet 5 during heating and bonding as shown in FIG. 4. This allows the melting point of the bonding layer 3 bonding the stage 2 of the lead frame and the semiconductor chip 1 together to be increased. Even if the semiconductor chip 1 has high operating temperature and generates a large amount of heat when the semiconductor chip 1 is included in, for example, a high-voltage power-supply device, the melting point of the bonding layer 3 can be made higher than the operating temperature of the semiconductor chip 1. This can suppress the occurrence of cracks in a molding resin 7, which occurs when the bonding layer 3 is melted by the heat generated by the semiconductor chip 1 operating at a high temperature, and therefore the semiconductor chip 1 is moved, even if the semiconductor chip 1 is used; hence, a high-reliability semiconductor device can be achieved. In particular, the fibrous material sheet 5 is uniformly present over the semiconductor chip-mounting region 2A and therefore the alloy of the fusible metal and the metal making up the fibrous metal material is also uniformly present over the semiconductor chip-mounting region 2A. Since a portion of the bonding layer 3 is partially alloyed, the unalloyed portion is melted, and therefore the molding resin 7 is cracked. In order to reduce displacement during manufacture, the fibrous material sheet 5 containing the fibrous metal material capable of being alloyed with the fusible metal contained in the bonding layer 3 need not be used or the bonding layer 3 need not be partly alloyed.

The temperature at which the fusible metal contained in the bonding layer 3 is melted or resin is cured is lower than the upper temperature limit of the semiconductor chip 1. In other words, the heating or bonding temperature, that is, the temperature to which the bonding layer 3 containing the fusible metal is heated for the purpose of bonding the semiconductor chip 1 to the semiconductor chip-mounting region 2A of the stage 2 is lower than the upper temperature limit of the semiconductor chip 1. Therefore, the semiconductor chip 1 is not defective and a high-reliability semiconductor device can be achieved.

Figure 5:
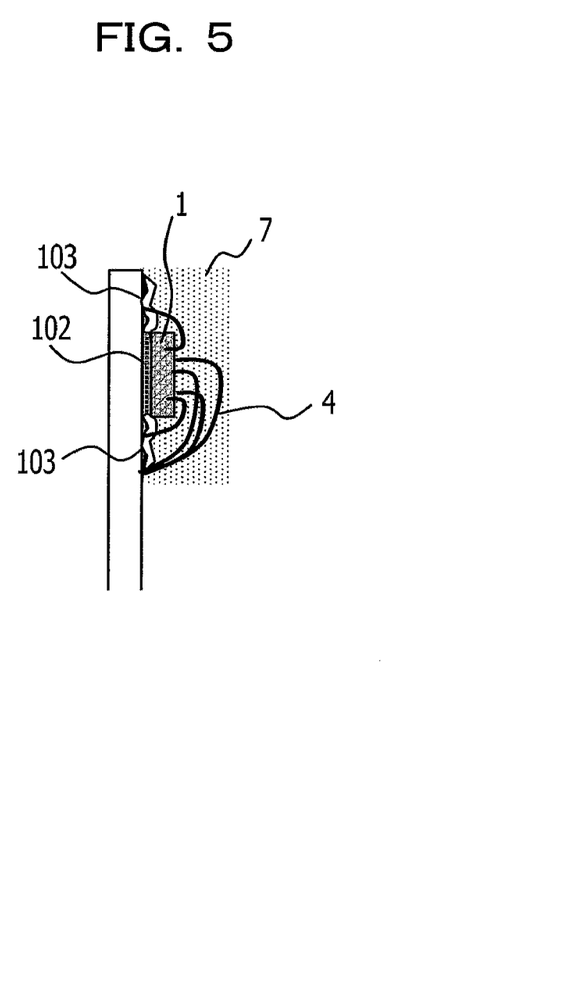
FIG. 5 is a sectional view illustrating a problem with a conventional method for manufacturing a semiconductor device.

On the other hand, in the case of using the die bonding agent (die attaching agent) 102 as shown in FIG. 5, the operating temperature of the semiconductor chip 1 is higher than or equal to the melting point of the die bonding agent 102 because the semiconductor chip 1 generates a large amount of heat as described above. Therefore, the adhesion of the die bonding agent 102 is lost, the semiconductor chip 1 is moved, and cracks 103 are formed in the molding resin 7; hence, it is difficult to achieve a high-reliability semiconductor device. When the bonding temperature of the die bonding agent 102 is high, the bonding temperature thereof exceeds the upper temperature limit of the semiconductor chip 1 and therefore defects are created in the semiconductor chip 1 in some cases.

Figures 6A, 6B:
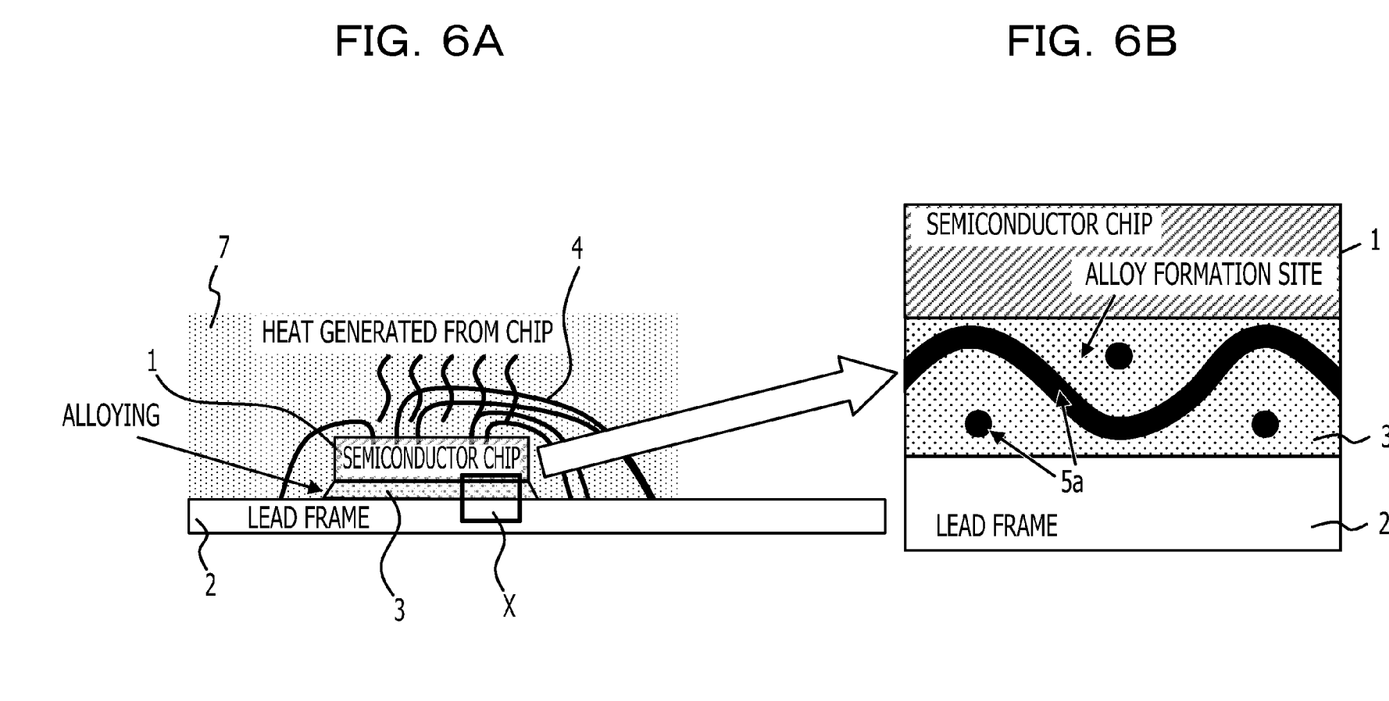
FIG. 6A is a sectional view illustrating the configuration and effect of a semiconductor device manufactured by the method according to the first embodiment.
FIG. 6B is an illustration depicting the configuration and effect of a semiconductor device manufactured by the method according to the first embodiment and is also a partly enlarged view of a region represented by the symbol X in FIG. 6A.

The stress caused by the difference in thermal expansion between the semiconductor chip 1 and the stage 2 of the lead frame can be relieved in such a manner that after the fusible metal contained in the bonding layer 3 is alloyed with the metal making up the fibrous material sheet 5, the fibrous metal material 5A is left in the bonding layer 3 as shown in FIGS. 6A and 6B. That is, the stress caused by the difference in thermal expansion between the semiconductor chip 1 and the stage 2 of the lead frame can be reduced with the fibrous metal material 5A left in the bonding layer 3 and therefore the reliability of the semiconductor device can be increased. In order to leave the fibrous metal material 5A in the bonding layer 3, for example, the fibrous metal material 5A making up the fibrous material sheet 5 may be thickened, the amount of the fibrous metal material 5A making up the fibrous material sheet 5 may be increased, or the fibrous material sheet 5 may be made from the fibrous metal material 5A such that the amount of the fibrous metal material 5A exceeds the limit of the amount of the metal capable of being alloyed with the fusible metal contained in the bonding layer 3.

The bonding layer 3 formed as described above has high thermal conductivity and therefore a high heat dissipation effect can be achieved.

Actually, semiconductor packages were prepared using fibrous material sheets 5 as described in the above embodiment and semiconductor packages were prepared using no fibrous material sheets 5 in comparative examples. These semiconductor packages were evaluated, whereby results below were obtained.

The fibrous material sheets 5 were fibrous metal sheets, made of copper, having a size of about 4.5 mm×about 7 mm. Bonding layers 3 were each formed using a Sn—Ag—Cu solder paste (Example 1), a Sn—Ag—Cu solder sheet (Example 2), or a heat-conductive adhesive (Example 3) containing Sn—Ag—Cu solder particles with an average size of about 22 μm. In the case of using the Sn—Ag—Cu solder paste, reflowing was performed at a maximum temperature of about 250° C. In the case of using the Sn—Ag—Cu solder sheet, ultrasonic temporary bonding was performed for the purpose of aligning a stage 2 of a lead frame with the fibrous material sheet 5 and for the purpose of aligning the fibrous material sheet 5 with the bonding layer 3 formed using the Sn—Ag—Cu solder sheet and reflowing was performed at a maximum temperature of about 250° C. in an $N_2$ atmosphere without using flux. FCB-2US (manufactured by Panasonic Factory Solutions Co., Ltd.) was used for ultrasonic temporary bonding, the ultrasonic power thereof was about 80%, and the amplitude was about 2.5 μm. In the case of using the heat-conductive adhesive, heating was performed at about 250° C. for about ten minutes in a thermostatic chamber.

For the semiconductor packages prepared using no fibrous material sheets 5, wire bonding failures due to the displacement of semiconductor chips 1 occurred in eight of 100 samples. In contrast, for the semiconductor packages prepared using the fibrous material sheets 5, wire bonding failures due to the displacement of semiconductor chips 1 did not occur in 100 samples.

The semiconductor packages (Examples 1 to 3) prepared using the fibrous material sheets 5 and the semiconductor packages (Comparative Examples 1 to 3) prepared using no fibrous material sheets 5 were subjected to a high-temperature storage test in such a manner that an about 200° C. thermostatic chamber was used to simulate device-operating temperatures. As a result, failures due to the delamination of a molding compound 7 occurred in the semiconductor packages prepared using no fibrous material sheets 5; however, failures due to delamination did not occur in the semiconductor packages prepared using the fibrous material sheets 5.

The semiconductor packages (Examples 1 to 3) prepared using the fibrous material sheets 5 and the semiconductor packages (Comparative Examples 1 to 3) prepared using no fibrous material sheets 5 were observed in cross section and elements in bonding layers were analyzed. As a result, it was confirmed that $Cu_6Sn_5$, which is a stable species among Sn—Cu alloys, was present in the semiconductor packages prepared using the fibrous material sheets 5 and about 6 μm of a fibrous material 5A, containing Cu, making up the fibrous material sheets 5 remained unreacted.

Furthermore, in order to evaluate the semiconductor packages (Examples 1 to 3) prepared using the fibrous material sheets 5 and the semiconductor packages (Comparative Examples 1 to 3) prepared using no fibrous material sheets 5 for reliability, a temperature cycle test was performed. Conditions of the temperature cycle test were as follows: each semiconductor package was maintained at about −55° C. and 125° C. for about 15 minutes and was maintained at about 25° C. for about five minutes. As a result, for the semiconductor packages prepared using no fibrous material sheets 5, defects were created in 16 of 200 samples after 500 cycles; however, for the semiconductor packages prepared using the fibrous material sheets 5, no defects were created in 200 samples.

Figure 8:
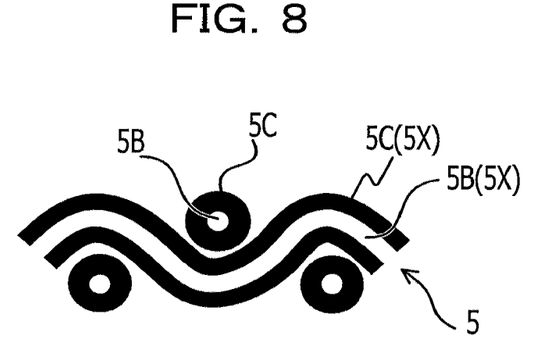
FIG. 8 is a sectional view of a sheet containing a fibrous material prepared using a composite material used in a method for manufacturing a semiconductor device according to a modification of the first embodiment.

In the above embodiment, the semiconductor device is manufactured using the fibrous material sheet 5 containing the fibrous metal material. The embodiment is not limited to the fibrous material sheet 5. The semiconductor device may be manufactured using a fibrous material sheet 5 containing a fibrous metal material 5B (5X) having at least one outer surface having a metal 5C as shown in FIG. 8. The fibrous material sheet 5 is of a network as shown in FIG. 8. The fibrous material sheet 5 is not limited to such a network and may be nonwoven (see FIG. 2B).

For example, the following sheet may be used: a fibrous material sheet 5, containing a fibrous resin material 5B, having an outer surface covered with a metal 5C. That is, the following sheet may be used: a sheet 5 having a central portion made of a resin material 5B and an outer portion, surrounding the central portion, containing a fibrous material 5X prepared using a composite material containing a metal material 5C. Alternatively, for example, the following sheet may be used: a fibrous material sheet 5, containing a fibrous glass material 5B, having an outer surface covered with a metal 5C. That is, the following sheet may be used: a sheet 5 having a central portion made of a glass material 5B and an outer portion, surrounding the central portion, containing a fibrous material 5X prepared using a composite material containing a metal material 5C.

In particular, the following sheet is preferably used: a sheet 5 containing a fibrous material 5B having at least one outer surface having a metal 5C capable of being alloyed with the fusible metal.

For example, the following sheet may be used: a fibrous material sheet 5, containing a fibrous metal material 5B unreactive with the fusible metal, having an outer surface covered with a metal 5C capable of being alloyed with the fusible metal. That is, the following sheet may be used: a fibrous material sheet 5 having a central portion made of a metal material 5B (for example, Cr or the like) incapable of being alloyed with the fusible metal and an outer portion, surrounding the central portion, containing a fibrous material 5X prepared using a composite material containing a metal material 5C capable of being alloyed with the fusible metal. Alternatively, for example, the following sheet may be used: a fibrous material sheet 5, containing a fibrous resin material 5B, having an outer surface covered with a metal 5C capable of being alloyed with the fusible metal. That is, the following sheet may be used: a sheet 5 having a central portion made of the metal material 5B and an outer portion, surrounding the central portion, containing a fibrous material 5X prepared using a composite material containing a metal material 5C capable of being alloyed with the fusible metal. For example, the following sheet may be used: a fibrous material sheet 5, containing a fibrous glass material 5B, having an outer surface covered with a metal 5C capable of being alloyed with the fusible metal. That is, the following sheet may be used: a fibrous material sheet 5 having a central portion made of a glass material 5B and an outer portion, surrounding the central portion, containing a fibrous material 5X prepared using a composite material containing a metal material 5C capable of being alloyed with the fusible metal. In other words, the following sheet may be used: a fibrous material sheet 5 having a central portion made of a material 5B incapable of being alloyed with the fusible metal and an outer portion, surrounding the central portion, containing a fibrous material 5X prepared using a composite material containing a metal material 5C capable of being alloyed with the fusible metal. Such a fibrous material sheet 5 containing a fibrous material 5X prepared using a composite material can be prepared in such a manner that, for example, a metal layer 5C is formed on an outer surface of a fibrous material (a fibrous metal material unreactive with the fusible metal, a fibrous resin material, or a fibrous glass material) 5B making up a sheet 5 by an electroless plating process or a metal vapor deposition process.

In the case of manufacturing the semiconductor device using a sheet 5 containing a fibrous material 5B (5X) having at least one outer surface having a metal 5C, the obtained semiconductor device includes the stage 2, the semiconductor chip 1 placed on the stage 2, and the bonding layer 3. The bonding layer 3 contains the fusible metal and the fibrous material 5B (5X) having at least one outer surface having the metal 5C and bonds the stage 2 and the semiconductor chip 1 together.

In the case of using, for example, a sheet 5 containing a fibrous resin material 5B having an outer surface covered with a metal 5C, the bonding layer 3 contains the fusible metal and the fibrous resin material (fibrous material) 5B having the outer surface covered with the metal 5C. In the case of using, for example, a fibrous material sheet 5 containing a fibrous glass material 5B having an outer surface covered with a metal 5C, the bonding layer 3 contains the fusible metal and the fibrous glass material (fibrous material) 5B having the outer surface covered with the metal 5C.

In particular, in the case of using, for example, a sheet 5 containing a fibrous material 5B (5X) having an outer surface having a metal 5C capable of being alloyed with the fusible metal, the bonding layer 3 contains an alloy of the fusible metal and the metal 5C (that is, the metal making up the fibrous material) and also contains the fibrous material 5B.

Alternatively, in the case of using, for example, a fibrous material sheet 5, containing a fibrous metal material 5B unreactive with the fusible metal, having an outer surface covered with a metal 5C capable of being alloyed with the fusible metal, the bonding layer 3 contains an alloy of the fusible metal and the metal 5C (that is, a metal making up a fibrous material) and also contains the fibrous metal material 5B unreactive with the fusible metal. In the case of using, for example, a fibrous material sheet 5 containing a fibrous resin material 5B having an outer surface covered with a metal 5C capable of being alloyed with the fusible metal, the bonding layer 3 contains an alloy of the fusible metal and the metal 5C (that is, a metal making up a fibrous material) and also contains the fibrous resin material 5B (fibrous material). In the case of using, for example, a sheet 5 containing a fibrous glass material 5B having an outer surface covered with a metal 5C capable of being alloyed with the fusible metal, the bonding layer 3 contains an alloy of the fusible metal and the metal 5C (that is, a metal making up a fibrous material) and also contains the fibrous glass material 5B (fibrous material).

In the case of forming the bonding layer 3 from the heat-conductive adhesive, the bonding layer 3 of the manufactured semiconductor device further contains resin.

Figure 9:
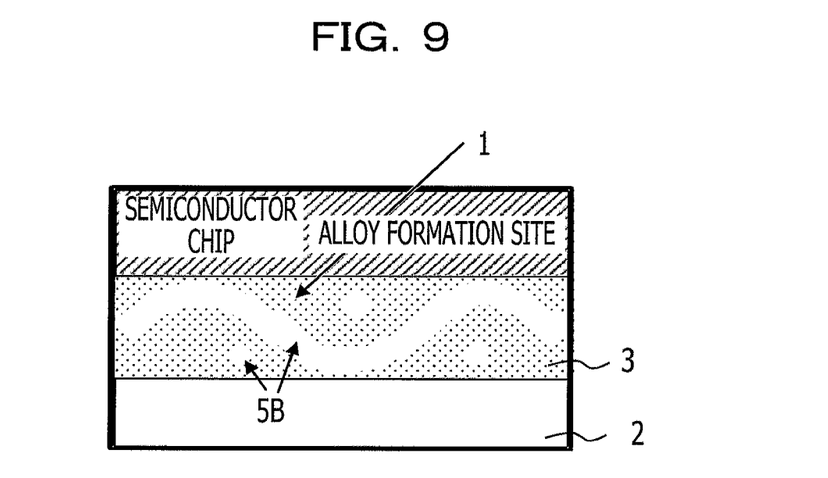
FIG. 9 is a sectional view illustrating the configuration and effect of a bonding layer of a semiconductor device manufactured by a method according to a modification of the first embodiment.

In the case of using a fibrous metal material (for example, Cr or the like) unreactive with the fusible metal, a fibrous resin material, or a fibrous glass material as a fibrous material 5B, the fibrous material 5B remains in the bonding layer 3 as shown in FIG. 9. The fibrous material 5B remaining in the bonding layer 3 can relieve the stress caused by the difference in thermal expansion between the semiconductor chip 1 and the stage 2 of the lead frame and therefore the reliability of the semiconductor device can be increased. That is, the use of the fibrous metal material (for example, Cr or the like) unreactive with the fusible metal or the fibrous resin material allows the stress caused by the difference in thermal expansion between the semiconductor chip 1 and the stage 2 of the lead frame to be relieved because the fibrous metal material and the fibrous resin material have a low modulus of elasticity. Alternatively, the use of the fibrous glass material allows the stress caused by the difference in thermal expansion between the semiconductor chip 1 and the stage 2 of the lead frame to be relieved or the stress applied to the interface between the between the semiconductor chip 1 and the stage 2 of the lead frame to be relieved when the fibrous glass material has a thermal expansion coefficient between that of a material making up the semiconductor chip 1 and that of a material making up the stage 2 of the lead frame.

Actually, semiconductor packages were prepared using fibrous material sheets 5 prepared using such composite materials and semiconductor packages were prepared using no fibrous material sheets 5 in comparative examples. These semiconductor packages were evaluated, whereby results below were obtained.

The fibrous material sheets 5 prepared using the composite materials had a size of about 4.5 mm×about 7 mm and were sheets which contained a fibrous material 5X prepared using a composite material and which each had a central portion made of an epoxy resin 5B and an outer portion, surrounding the central portion, made of copper (Cu) 5C. In examples and the comparative examples, bonding layers 3 were formed using a Sn—Ag—Cu solder paste and reflowing was performed at a maximum temperature of about 250° C.

For the semiconductor packages prepared using no fibrous material sheets 5, wire bonding failures due to the displacement of semiconductor chips 1 occurred in eight of 100 samples. In contrast, for the semiconductor packages prepared using the fibrous material sheets 5, wire bonding failures due to the displacement of semiconductor chips 1 did not occur in 100 samples.

The semiconductor packages prepared using the fibrous material sheets and the semiconductor packages prepared using no fibrous material sheets 5 were subjected to a high-temperature storage test in such a manner that an about 200° C. thermostatic chamber was used to simulate device-operating temperatures. As a result, at about 200° C., which is close to the melting point of an Sn—Ag—Cu solder, failures due to the delamination of a molding compound 7 occurred in the semiconductor packages prepared using no fibrous material sheets 5; however, failures due to delamination did not occur in the semiconductor packages prepared using the fibrous material sheets 5.

The semiconductor packages prepared using the fibrous material sheets 5 and the semiconductor packages prepared using no fibrous material sheets 5 were observed in cross section and elements in bonding layers 3 were analyzed. As a result, it was confirmed that $Cu_6Sn_5$, which is a stable species among Sn—Cu alloys, was present in the semiconductor packages prepared using the fibrous material sheets 5 and about 6 µm of a fibrous material 5B, containing an epoxy resin, making up the fibrous material sheets 5 remained unreacted.

Furthermore, in order to evaluate the semiconductor packages prepared using the fibrous material sheets 5 and the semiconductor packages prepared using no fibrous material sheets 5 for reliability, a temperature cycle test was performed. Conditions of the temperature cycle test were as follows: each semiconductor package was maintained at about −55° C. and 125° C. for about 15 minutes and was maintained at about 25° C. for about five minutes. As a result, for the semiconductor packages prepared using no fibrous material sheets 5, defects were created in 16 of 200 samples after 500 cycles; however, for the semiconductor packages prepared using the fibrous material sheets 5, no defects were created in 200 samples.

In the above embodiment, the discrete package is exemplified. The above embodiment is not limited to the discrete package and another type of semiconductor package may be used. In the above embodiment, the semiconductor device is manufactured using the lead frame. Therefore, the manufactured semiconductor device includes the semiconductor chip 1 placed on the stage 2 of the lead frame. The semiconductor device is not limited to such a configuration. In the above embodiment, the semiconductor package is exemplified. The above embodiment is not limited to such a semiconductor package. The present embodiment can be applied to, for example, a semiconductor device including a semiconductor chip 1 placed on a circuit board such as a package board or a printed board (wiring board). In this case, a semiconductor chip-mounting region of the circuit board is metallized with, for example, Cu—Ni—Au, Cu, Cu—Au, Cu—Ag, Cu—Ni—Pd—Au, or the like. The circuit board, such as a package board or a printed board, is also referred to as a substrate.

A power supply unit according to a second embodiment will now be described with reference to FIG. 10.

The power supply unit according to this embodiment includes a semiconductor package including the above-mentioned GaN-HEMT.

The case of using the GaN-HEMT, which is included in the semiconductor package, in a power factor correction (PFC) circuit included in a power supply unit used for servers is exemplified below.

Figure 10:
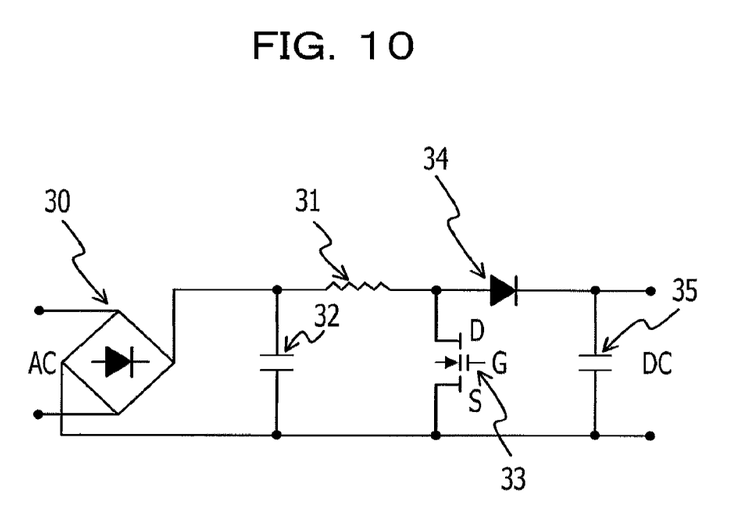
FIG. 10 is an illustration depicting an example of the configuration of a PFC circuit included in a power supply unit according to a second embodiment.

With reference to FIG. 10, the PFC circuit includes a diode bridge 30; a choke coil 31; a first capacitor 32; the GaN-HEMT 33, which is included in the semiconductor package; a diode 34; and a second capacitor 35.

The PFC circuit has a configuration in which the diode bridge 30; the choke coil 31; the first capacitor 32; the GaN-HEMT 33, which is included in the semiconductor package; the diode 34; and the second capacitor 35 are mounted on a circuit board.

In this embodiment, the semiconductor package includes a drain lead 23, a source lead 22, and a gate lead 21 which are inserted in a drain lead insertion portion, source lead insertion portion, and gate lead insertion portion, respectively, of the circuit board and which are fixed thereto by, for example, soldering or the like. The PFC circuit is disposed on the circuit board as described above and is coupled to the GaN-HEMT 33, which is included in the semiconductor package.

In the PFC circuit, one terminal of the choke coil 31 and an anode terminal of the diode 34 are coupled to a drain electrode D of the GaN-HEMT 33. One terminal of the first capacitor 32 is coupled to the other terminal of the choke coil 31. One terminal of the second capacitor 35 is coupled to the other terminal of the diode 34. The other terminal of the first capacitor 32, a source electrode S of the GaN-HEMT 33, and the other terminal of the second capacitor 35 are grounded. A pair of terminals of the diode bridge 30 is coupled to both terminals of the first capacitor 32. Another pair of terminals of the diode bridge 30 are coupled to input terminals supplied with an alternating-current (AC) voltage. Both terminals of the second capacitor 35 are coupled to output terminals outputting a direct-current (DC) voltage. A gate driver, which is not shown, is coupled to a gate electrode G of the GaN-HEMT 33. In the PFC circuit, the GaN-HEMT 33 is driven by the gate driver, whereby an AC voltage input from the input terminals is converted into a DC voltage, which is output from the output terminals.

Thus, the power supply unit according to this embodiment has an advantage that reliability can be increased. Since the semiconductor package, having high reliability, described in the first embodiment or a modification is used, there is an advantage that a high-reliability power supply unit can be configured.

The case of using the semiconductor device (a GaN-HEMT or a semiconductor package including a GaN-HEMT) in the PFC circuit included in the power supply unit used for servers is exemplified herein. The semiconductor device is not limited to such an application. The semiconductor device (a GaN-HEMT or a semiconductor package including a GaN-HEMT) may be used for, for example, electronics (electronic apparatuses), such as computers, other than servers. The semiconductor device (semiconductor package) may be used for other circuits (for example, DC-DC converters or the like) included in power supply units.

The present disclosure is not limited to the above embodiments or modifications and various variations can be made without departing from the scope of the present disclosure.

In each of the above embodiments or modifications, the semiconductor chip including the GaN-HEMT is exemplified. A semiconductor chip is not limited to such a configuration.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a semiconductor device, comprising:
    placing a sheet containing a fibrous material having at least one outer surface having a metal on a semiconductor chip-mounting region of a substrate;
    forming a bonding layer containing a fusible metal on the semiconductor chip-mounting region;
    placing a semiconductor chip on the semiconductor chip-mounting region;
    bonding the semiconductor chip to the semiconductor chip-mounting region with the fusible metal-containing bonding layer by heating; and
    temporarily bonding the sheet to the semiconductor chip-mounting region with an ultrasonic wave.

2. The method according to claim 1, wherein the sheet has an area substantially equal to the area of the semiconductor chip.

3. The method according to claim 1, wherein the sheet contains a fibrous material having at least one outer surface having a metal capable of being alloyed with the fusible metal.

4. The method according to claim 1, wherein the sheet is made of a fibrous metal material.

5. The method according to claim 1, wherein the sheet is made of a fibrous metal material capable of being alloyed with the fusible metal.

6. The method according to claim 1, wherein the sheet is made of a fibrous metal material, the fibrous metal material having an outer surface covered with a metal capable of being alloyed with the fusible metal, and the fibrous metal material being unreactive with the fusible metal.

7. The method according to claim 1, wherein the sheet is made of a fibrous resin material having an outer surface covered with a metal.

8. The method according to claim 1, wherein the sheet is made of a fibrous glass material having an outer surface covered with a metal.

9. The method according to claim 1, wherein the fusible metal-containing bonding layer is a layer containing a sheet-shaped fusible metal.

10. The method according to claim 9, further comprising:
    forming the sheet-shaped fusible metal-containing layer above the sheet; and
    when the temporary bonding of the sheet to the semiconductor chip-mounting region with the ultrasonic wave is performed, temporarily bonding the sheet and the sheet-shaped fusible metal-containing layer to the semiconductor chip-mounting region with the ultrasonic wave.

11. The method according to claim 1, wherein the fusible metal-containing bonding layer is a layer containing a pasty fusible metal.

12. The method according to claim 1, wherein the fusible metal-containing bonding layer is a layer containing a heat-conductive adhesive containing a fusible metal and resin.

13. The method according to claim 1, further comprising impregnating the sheet with flux when the fusible metal-containing bonding layer is a layer containing a sheet-shaped fusible metal.

14. A semiconductor device comprising:
a substrate having a semiconductor chip-mounting region;
a sheet on the semiconductor chip-mounting region, the sheet containing a fibrous metal material;
a bonding layer on the sheet, the bonding layer containing a fusible metal; and
a semiconductor chip on the bonding layer;
wherein the fibrous metal material being alloyed with the fusible metal and the bonding layer bonds the substrate and the semiconductor chip together,
wherein the bonding layer and the sheet are bonded to the semiconductor chip-mounting region with an ultrasonic wave.

15. The semiconductor chip according to claim 14, wherein the bonding layer contains an alloy of the fusible metal and a metal and a fibrous material.

16. The semiconductor chip according to claim 14, wherein the bonding layer contains an alloy of the fusible metal and a metal and a fibrous metal material.

17. The semiconductor chip according to claim 14, wherein the bonding layer contains an alloy of the fusible metal and a metal and a fibrous resin material.

18. The semiconductor chip according to claim 14, wherein the bonding layer contains an alloy of the fusible metal and a metal and a fibrous glass material.

19. A power supply unit comprising:
a semiconductor device including:
a substrate having a semiconductor chip-mounting region,
a sheet on the semiconductor chip-mounting region, the sheet containing a fibrous metal material,
a bonding layer on the sheet, the bonding layer containing a fusible metal,
a semiconductor chip on the bonding layer, and
wherein the fibrous metal material being alloyed with the fusible metal and the bonding layer bonds the substrate and the semiconductor chip together,
wherein the bonding layer and the sheet are bonded to the semiconductor chip-mounting region with an ultrasonic wave.

* * * * *